United States Patent [19]
Chen et al.

[11] Patent Number: 6,127,693
[45] Date of Patent: Oct. 3, 2000

[54] LIGHT EMITTING DIODE WITH BLUE LIGHT AND RED LIGHT EMITTING POLYMERS

[75] Inventors: Shou-An Chen; En-Chung Chang; Kuen-Ru Chuang, all of Hsinchu, Taiwan

[73] Assignee: National Science Council of Republic of China, Taipei, Taiwan

[21] Appl. No.: 09/108,978

[22] Filed: Jul. 2, 1998

[51] Int. Cl.[7] .............................. H01L 33/00; H01L 35/24
[52] U.S. Cl. ............................. 257/40; 257/103; 313/504
[58] Field of Search ............................... 257/40, 103, 79; 313/504, 506, 509, 512

[56] References Cited

U.S. PATENT DOCUMENTS

| | | | |
|---|---|---|---|
| 5,247,190 | 9/1993 | Friend et al. | 257/40 |
| 5,401,827 | 3/1995 | Holmes et al. | 528/374 |
| 5,408,109 | 4/1995 | Heeger et al. | 257/40 |
| 5,425,125 | 6/1995 | Holmes et al. | 313/504 |
| 5,514,878 | 5/1996 | Holmes et al. | 257/40 |

*Primary Examiner*—Minh Loan Tran
*Attorney, Agent, or Firm*—Bacon & Thomas

[57] ABSTRACT

The invention provides a novel polymer light-emitting diode (LED) which can emit near white light with a broad spectrum, which LED comprises a transparent electrode as an anode, a metal electrode as a cathode, an organic light-emitting layer, and a hole transport layer and/or an electron transport layer, wherein the organic light-emitting layer contains a blend of a blue light-emitting poly (paraphenylene vinylene) copolymer and a red light-emitting alkoxy-substrituted PPV derivative in an appropriate relative ratio, such that, the novel LED can emit sun light-like yellowish white light with an broad electroluminescent spectrum covering the whole range of visible light without varying as the voltage increased. And wherein, by virture of introducing a hole transport layer and/or electron transport layer, the turn-on voltage of the device can be lowered and emission efficiency thereof is increased.

17 Claims, 4 Drawing Sheets

---

TRANSPARENT ANODE ELECTRODE

LIGHT–EMITTING PPV COPOLYMER

HOLE TRANSPORT LAYER AND/OR ELECTRON TRANSPORT LAYER (OPTIONAL)

METAL CATHODE

LIGHT EMITTING DIODE WITH BLUE LIGHT AND RED LIGHT EMITTING POLYMERS

BACKGROUND OF THE INVENTION

The invention relates to a polymer light-emitting diode (LED) which can emit near white light with a broad electoluminescence spectrum, and to methods for preparing the same. Particularly, the invention relates to a LED having an organic light-emitting layer which comprises a blue-light emitting polyparaphenylene vinylene (PPV) copolymer and an orange-red (or red) light-emitting PPV alkoxy-substituted derivatives, and a process for fibricating the same.

Since Tang et al. (Appls. Phys. Lett., 515(1987)914) has made a device having the structure ITO/diamine/Alq3/Mg:Ag wherein ITO stands for indium/tin oxide, and Alq3 for tris(8-hydroxyquinioline) aluminum, because such device had an external quantum efficiency of 1% and exhibited a high brightness of 1000 cd/m$^2$ (10V), the study of organic light-emitting diode (LED) had been rapidly promoted. At 1990, the group of Cavendish Lab of Cambridge University, England, had made an LED having structure as ITO/PPV/Ca by using PPV as light-emitting layer, ITO as anode, and Ca as cathode, which had a quantum efficiency of 0.05% (Nature, 347(1990)539; U.S. Pat. No. 5,247,190 (1993); U.S. Pat. No. 5,425,125(1995); U.S. Pat. No. 5,401,827(1995)).

Heretofore, the most primary organic LED device comprises a single layer organic light-emitting layer which is interposed between a transparent electrode as anode) and a metal electrode (as cathode). Additionaly, in order to enhance the emission efficiency of the organic LED device, it can have two organic layers, the first layer as hole transport layer and the second layer as organic light-emitting layer, or, the first layer as organic light-emitting layer and the second layer as election transport layer. These two organic layers are interdisposed between a transparent electrode (as anode) and a metal electrode (as cathode). Furthermore, there are devices having three organic layers in an order as the hole transport layer, the organic light-emitting layer and the elentron transport layer, which are interdisposed between a transparent electrode (as an anode) and a metal electrode (as a cathode). The light-emitting process of this device comprises of, after applying a bias on such an LED, moving of holes and electrons from the anode and the cathode, respectively, under driving of electric field, transisting over their respective energy barriers and encountering at the light-emitting layer to form excitons which decay from the excited state to ground state and emit light.

PPV-based polymer has been extensively used in the fibracation of LED due to their excellent fluorescent property, however, since PPV is insoluble and in fusible, it has to coat by using a solution of precursor thereof and carry out an eliminating reaction by heating under vacuum to obtain PPV. In order to simplify the process for fibricating such devices, long chain alkyl or alkoxy had been attached onto the side chain of PPV (U.S. Pat. No. 5,408,109(1995)) at the aim of increasing the solubility thereof such that they can dissolve in common organic solvents, and at the same time, change their energy gaps. Alternatively, a block copolymer had been synthesized firstly by Karasz (Macromolecules, 26(1993)1188, Macromolecules, 26(1993)6570) through Wittig reaction, which comprised a rigid segment and a soft segment, wherein the rigid segment was the paraphenylene vinylene segment which could change the color of light by varying length thereof, and wherein the soft segment included the alkyl, ether groups and ester groups, which functioned in enhancing the solubility and film-forming property.

Currrently, light colors emitted by polymer LED include blue, green and even to infrared, which can be determined through selecting from a single material or through blending of two or more of polymers. The earliest study in this field had been conducted by Yoshino (Jpn. J. Appl. Phys., 32(1993)L921) who blended poly(di-octyloxy phenylene vinylene (PdPOV) with Alq3 and then fibricated an device whose light color could change gradually from orange (light color of PdOPV) to yellowish-green (light color of Alq3) with increase of applied voltage. Heeger (J. Elec. Mater, 20(1991)945) blended poly(2-cholestanoxy-5-thexyldimethylsiltyl-1,4-phenylene vinylene)(CS-PPV) with 2-(4-biphenylyl)-5-(4-tert-butylphenyl)-1,3,4-oxadiazole)(PBD) and then fibricated a device, and found that amount of PBD had not any effect on the shape of electroluminescent (EL) spectrum. Further, Karasz (J. Appl. Phys., 76(1994)2419) blended poly (9-vinylcarbazole) (PVK) with conjugated non-conjugated multiblock PPV copolymer (CNMBC) in various ratios and then fabricated an device therefrom, and found that, at PVK content of 3%, a new peak appeared in the EL spectrum thereof which was different to spectra of original two polymers, due to formation of an exciplex from the interaction between PVK and CNMBC.

Inganas (Nature; 372(1994)444) used blends of polythiophene derivatiaves having different substitutent as light-emitting layers and found that, under an applied voltage, it could emit initially a light color generated from polymer having a low energy gap and as the voltage was increased, light color generated from polymer having a high energy gap began to appear, and thus obtained a device whose light color could be controled by a voltage. In 1996, this research group (Appl. Phys. Lett., 68(1996)147) blended three polythiophene derivatives, that is, poly(3-methyl-4-octylthiophene) (PMOT), poly(3-cycolhexylthiophene) (PCHT), and poly [3-(4-octylphenyl)-2,2'-bithiophene] (PTOPT), with polymethyl methacrylate (PMMA) as binder, and found an optimal white light emitting conditions at weight ratio of PMOP:PCHP:PTOPT:PMMA as 10:4:1:1, wherein, under a operating voltage of 20 V, λmax of EL spectrum thereof were 465 nm and 620 nm. However, under a operating voltage between turn-on voltage and 20 V, its light color changed with applied voltages.

In summary, heretofore, electroluminescent spectrum of organic LED can extend from ultraviolet to infrared. Emission spectra of LED may be affected by conjugated structures in polymer main chains, and additionally, energy gaps thereof can be controlled by incorporating substitutends having different functionalities so that a variety of light color can output, Furthermore, by blending several kinds of polymer each having different energy gap and controlling various applied voltages, a variety of light color can be output and even white light-emitting diodes can be obtained. However, white light-emitting diodes cited in literatures emit red light at low voltage and could emit white light only at 20V. In this respect, after an intensive study, the inventor of this application obtained eventualy a novel polymer LED which can emit near white light with a broad electroluminescent spectrum under various voltages.

SUMMARY OF THE INVENTION

Accordingly, the invention relates to a novel polymer light-emitting diode (LED) which can emit near white light with a broad electroluminescent (EL) spectrum, characterized in that it comprises a blend of two polymers as light-emitting layer which can emit near white light with a broad electroluminescent spectrum under various voltages.

In another aspect, the invention relates to a novel polymer LED which can emit near white light with a broad EL spectrum, characterized in that in addition to the above-described blend of two polymers as light-emitting layer, it contains a hole transport layer and/or a electron transport layer.

In still another aspect, the invention relates to a process for fibricating a novel polymer LED which can emit near white light with a broad EL spectrum, which comprises blending a blue light-emitting polyparaphenylene vinylene (PPV) copolymer and red light-emitting alkoxy-substituted derivatives of PPV in an appropriate ratio, applying the resulting blend on a electrode substrate to form an anode, and metal plating another substrate to form a cathode, and thus obtaining the desired LED.

BRIEF DESCRIPTION OF THE DRAWINGS

The drawings disclose an illustrative embodiment of the present invention which serves to exemplify the various advantages and objects hereof, and are as follows.

Figure 1:
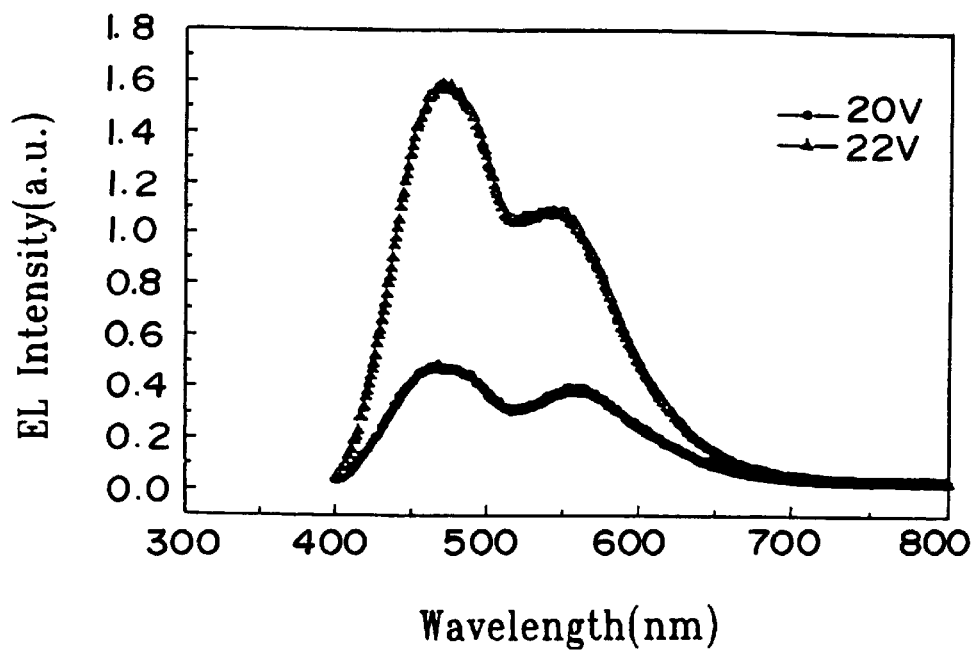
FIG. 1 shows an EL spectrum of a device ITO/PPVCOC10:C10O-CNPPV(200:1)/Al under various applied voltages.

As described above, in one aspect, the invention relates to a novel polymer LED which can emit near white light with a broad EL spectrum, which comprises a transparent electrode as the anode, a metal electrode as the cathode, an organic light-emitting layer and an additional hole transport layer and/or an electron transport layer.

The transparent electrode used in the novel polymer LED according to the invention is the customarily used one, which can be formed by vapor depositing indium/tin oxide, (ITO) on an organic plastic substrate or glass, or by applying a conductive polymer on an organic plastic substrate or glass, and used as an anode.

The cathode metal used in the novel polymer LED according to the invention may be In, Al, Al:Li alloy, Mg/Ag, Mg:Ag alloy, Ca/Ag or Ca/Al, etc.

The object of the invention is to obtain an LED which can emit white light, so that, the invention adopts a PPV copolymer which emits blue light—the shorter wavelength range of the visible spectrum, together with an alkoxy-substituted derivative of PPV which emits red light—the long wavelength range in the visible spectrum. Because the emission efficiency of PPV copolymer tend to be small, while that of the alkoxy-substituted PPV is higher, the amout of PPV copolymer used in preparing the blend as light-emitting layer should be larger than that of the alkoxy-substituted PPV in order to obtain a broad near white light spectrum.

The invention adopts two polymer materials having similar chemical structures, which including a blue light-emitting PPV copolymer represented by structure I below and a red light-emitting alkoxy-substituted PPV derivative represented by structure II

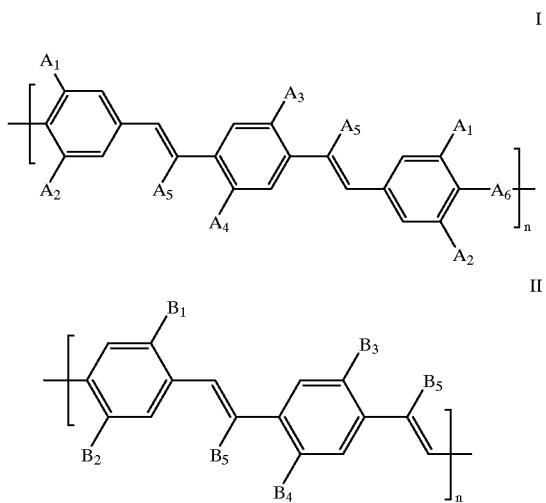

wherein,

A1, A2 may be H, or —OCH$_3$;

A3, A4 may be H, —(CH$_2$)$_n$CH$_3$, —O—(CH$_2$)$_n$CH$_3$, —(CH$_2$)$_n$—O—(CH$_2$)$_n$CH$_3$, —(CH$_2$—CH$_2$—O)$_n$CH$_3$ (n=1~22);

A5 may be H, —CN;

A6 may be —O—(CH$_2$)$_n$O—, —O—CH$_2$—CH$_2$—(O—CH$_2$—CH$_2$)$_n$—O—, —OCO(CH$_2$)$_n$ —OCO—,(n=1~12);

B1, B2, B3, B4 may be —O—CnH2n+1 (n=6~22), —O—(CH2—CH2-O)nCH3 (n=1~10);and

B5 may be H, —CN.

Preferably, the PPV copolymer is the one represented by structure I wherein A1, A2 is —O—CH$_3$; A3, A4, A5 is H; A6 is -O—(CH$_2$)n—O—, where n is an integer of 5, 8 or 10. And also preferably, said PPV copolymer is the one represented by structure I wherein A1, A2 is —O—CH3; A3, A4 is H; A5 is —CN; A6 is —O—(CH2)n—O—, where n is an integer of 5, 8, or 10.

Further, preferably, the alkoxy-substituted PPV derivative is the one represented by structure II wherein B1,B2, B3 and B4 are —O—CnH$_{2n+1}$, where n=6,8,10; B5 is H. And also preferably, said alkoxy-substituted PPV derivative is the one represented by structure II wherein B1, B2, B3, and B4 are —O—CnH$_{2n+1}$, where n=6,8, 10; and B5 is —CN.

Syntheses of polymers used in the invention have been described in, for example, Macromolecules, 26(1993)1188; U.S. Pat. No. 5,514,878(1996); Synth. Met,. 29(1989)E129. The blue light-emitting PPV copolymer used in Examples according to the invention is PPVCOC10; and there two red light-emitting alkoxy-substituted PPV derivatives used in Examples according to the invention, namely, C10O-CNPPV and PdOPV; structures of these three polymers are shown below:

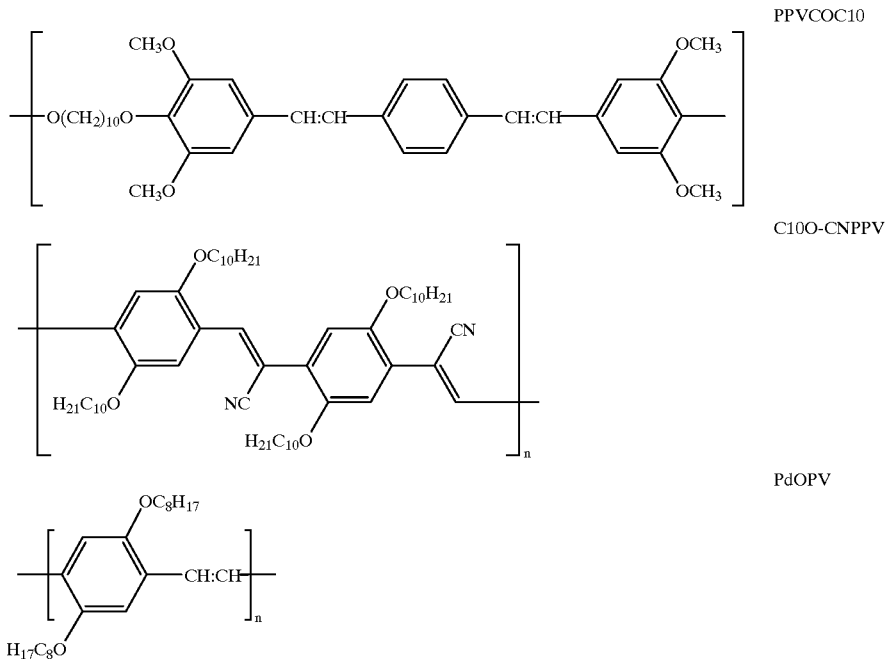

PPVCOC10

C10O-CNPPV

PdOPV

It is found that, when weight ratio of the blue light-emitting PPV to the red light-emitting polymer, such as alkoxy-substituted PPV lies in the range of 150:1~10:1, an LED which can emit yellowish white light having a wavelength of 400 to 650 nm can be obtained.

The novel polymer LED according to the invention contains further an additional hole transport layer and/or an electron transport layer.

In general, a device having a single layer structure tends to exhibit poor stability and low emission efficiency, and needs higher turn-on voltage. In order to improve the performance of an device, it is essential to introduce an hole transport layer and/or an electron transport layer so as to improve turn-on voltage, operating voltage, emission efficiency and stability hereof. Heeger et al. (Nature, 357(1992) 477) fibricated a device having a structure as PET/PAn-CSA/MEH-PPV/Ca, wherein, a thin polyethylene terephthalate (PET) sheet coated with polyaniline (PAn) which had been doped with camphor sulphonic acid (CSA) was used in state of ITO as the anode to form said flexible LED. In 1995, Heeger group (J. Appli. Phys., 77(1995)694) fibricated a device having a structure as ITO/PAn-CSA-PES/MEH-PPV/Li:Al(alloy), wherein, a diode having PAn network electrode was used to increase the emission of holes. In 1996 (J. Appl. Phys., 79(1996)934), they, by using a soluble poly(2-decyloxy-1,4-phene)(DO-PPP), fibricated further a device having a double layer structure ITO/PVK/DO-PPP/CA which contained an hole transport layer PVK therein, and found that the quantum efficiency of said the device could be up to 1% to 3%, and if one more PAn layer was added, the turn-on voltage of the device ITO/PAn/PVK/DO-PPP/Ca could reduce by 30%. The above-described PAn-CSA can be used as an hole transport layer and as an hole injection layer. Mullen et al. (Synth. Met., 67(1994) 181), by using PPV as the hole transport layer, fibricated a double layer structural diode ITO/PPV/L-PPP/Ca which could emit yellow light, had a quantum efficiency of 0.6% and exhibited a brightness up to 1000 cd/m$^2$. The Cambridge group (Appl. Phys. Lett., 61(1992)2793), in view of the low efficiency exhibited by single layer device, had incorporated a polymer layer formed by disperssing 2-(4-biphenylyl)-5-(4-tert-butylphenyl)-1,3,4-oxadiazole (PBD) in PMMA as electron transport layer in order to increase electron transporting amount and to prevent hole from passing too rapidly through the polymer layer, as well as to allow holes accumulated at interface of in PPV/PBD-PMMA to increase recombination of holes and electrons so that its quantum efficiency can be greatly improved from 0.05% to 0.8%. As the use of hole transport layer, PPV, PVK and polyaniline (PAN) derivatives were generally adopted. The hole transport layer used in the invention comprises PAN derivative such as a sulfonic acid ring-substituted polyaniline (SPAN) (J. Am. Chem. Soc, 112(1990)2800; U.S. Pat. No. 5,159,031; Macromolecules, 29(1996)3950), or poly(aniline-co-N-propane sulfonic aicd aniline) (PAPSAH) (J.Am. Chem. Soc.116(1994)7939; J. Am. Chem. Soc., 117(1995)10055; U.S. Pat. No. 5,641,859), which can lower the turn-on electric field of the device by one third (see, Example 5); or poly(3-alkyl sulfonic acid thiophene), wherein the alkyl moiety is $C_nH_{2n+1}$, n=2, 4, 6.

In another aspect, in order to obtain the above-described novel polymer LED which can emit near white light with a broad electroluminescent spectrum, a process for fibricating said novel LED is provided, said process comprises dissolving a blue light-emitting copolymer having paraphenylene vinylene luminescent groups and soft groups represented by the above structure (I), and a red light-emitting PPV copolymer having pendant alkoxy groups, in a suitable organic solvent separately, blending said two solutions in an appropriate ratio to form a homogeneous mixed solution, applying said mixed solution onto a substrate for forming an anode, drying said coating into an uniform film, and, plating another electrode under high vacuum for forming a cathode.

PPV copolymers and alkoxy-substituted PPV derivatives suitable for the invention are those described hereinbefore.

Organic solvents suitable for dissolving PPV copolymers and alkoxy-substituted PPV derivatiaves in the process for fibricating a novel polymer LED according to the invention include, but not limited to, chloroform, toluene, tetrahydrofuran and the like.

Electrodes used in the process for fibricating a novel polymer LED according to the invention are those described above, wherein metals used in the cathode can be deposited on the substrate by thermal sublimation or sputtering.

In one embodiment, the process for fibricating a novel polymer LED according to the invention comprises further a step of interposing an hole transport layer between the anode and the organic light-emitting layer, which comprises applying the above-described aqueous solutions of SPAN, or PAPSAH and drying the resulted coating.

In another embodiment, the process of the invention comprises further a step of interposing an electron transport layer between the organic light-emitting layer and the cathode.

In still another embodiment, the process of the invention comprises further a step of interposing an hole transport layer between the anode and the organic light-emitting layer as well as interposing an electron transport layer between the organic light-emitting layer and the cathode.

The white light-emitting diode fibricated by the process of the invention is different from that made by Kido (Appl. Phys. Lett., 64(1994)815; Science, 267(1995)1332) through incorporating arbitrarily small molecular dyes having different light colors into PVK; it is also different from the Inganlas's device which as made by blending a variety of polythiophene derivatives and adding PMMA as binder and which could exhibit white light only at certain voltage.

Light colors emitted by conventional blend devices will vary with applied voltages, and it is known from the course of developing the invention that polymers having low energy gap contained in such devices tends to be destroyed readily as the voltages increased, which make those devices unpractical. A good blend device should emit its whole color from the beginning, i.e. a broad spectrum, and that spectrum persists as the voltage increased.

White LED produced by the process of the invention can be applied in various displays and as backlight sources for displays such as electronic wristlet watches, liquid crystal display and toys.

DETAILED DESCRIPTION OF THE PREFERRED

EMBODIMENTS EXAMPLES

The invention will be further described more detailed by means of following illustrative but not limitative Examples.

EXAMPLE 1

Solutions of PPVCOC10 and C10O-CNPPV in chloroform were prepared separately each at a concentration of 10 mg/ml, and mixed the two resulted solutions at a ratio of PPVCOC10:C10O-CNPPV 200:1 to form a blend solution. The blend solution was spin-coated on a pre-cleaned ITO glass at a speed of 1000 rpm to form a film having thickness of 800 Å. Aluminum was vapour deposited under a degree of vacuum of $1\times10^{-6}$ torr to obtain a light-emitting area of 0.08 $cm^2$. Voltage was applied on this device and found a yellowish white light was emitted at 15 V with a EL spectrum covering a wavelength range of 400 nm to 650 nm. As the voltage increased, the EL intensity was increased proprotionately, which indicated that its light color did not change with the voltage (as shown in FIG. 1).

EXAMPLE 2

Figure 2:
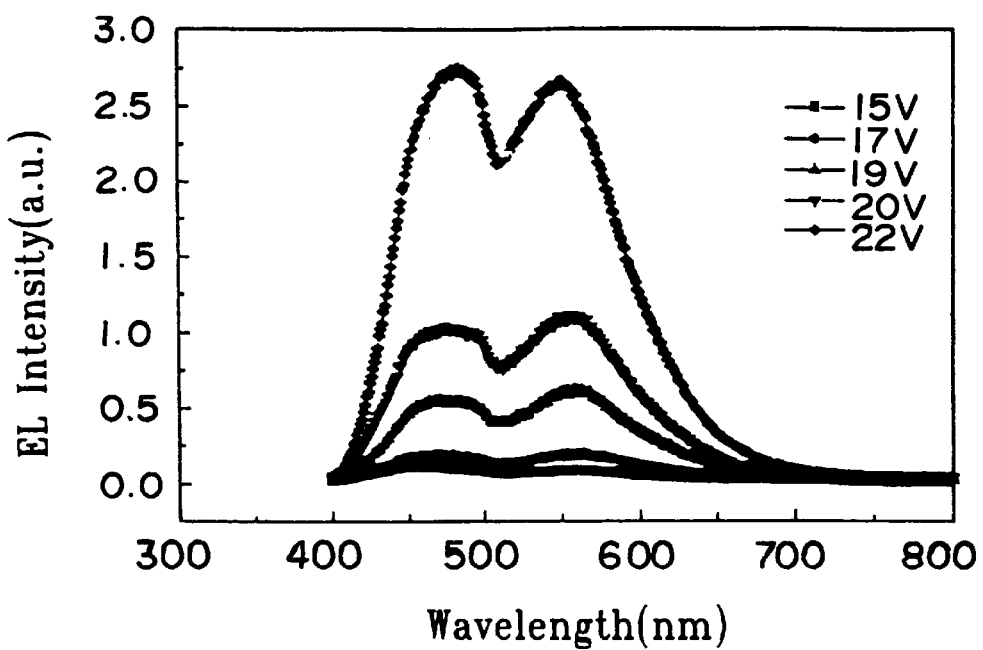
FIG. 2 shows an EL spectrum of an device ITO/PPVCOC10:C10O-CNPPV(150:1)/Al under various applied voltages.

Solutions of PPVCOC10 and C10O-CNPPV in chloroform were prepared separately each at a concentration of 10 mg/ml, and mixed the two resulted solutions at a ratio of PPVCOC10:C10O-CNPPV 150:1 to form a blend solution. The blend solution was spin-coated on a pre-cleaned ITO glass at a speed of 1000 rpm to form a film having thickness of 800 Å. Aluminum was vapour deposited under a degree of vacuum of $1\times10^{-6}$ torr to obtain a light-emitting area of 0.08 $cm^2$. Voltage was applied on this device and found a yellowish white light was emitted at 15 V with a EL spectrum covering a wavelength range of 415 nm to 650 nm. As the voltage increased, the its EL intensity was increased proprotionately, which indicated that its light color did not change with the voltage (as shown in FIG. 2).

EXAMPLE 3

Figure 3:
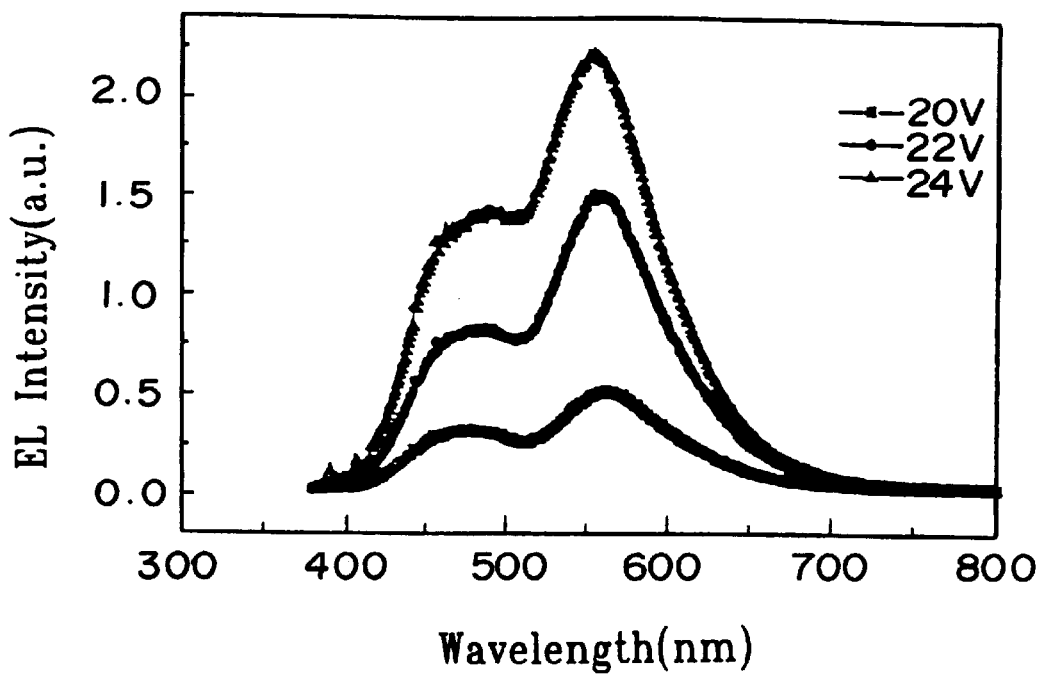
FIG. 3 shows an EL spectrum of an device ITO/PPVCOC10:C10O-CNPPV(100:1)/Al under various applied voltages.

Solutions of PPVCOC10 and C10O-CNPPV in chloroform were prepared separately each at a concentration of 10 mg/ml, and mixed the two resulted solutions at a ratio of PPVCOC10:C10O-CNPPV 100:1 to form a blend solution. The blend solution was spin-coated on a pre-cleaned ITO glass at a speed of 1000 rpm to form a film having thickness of 800 Å. Aluminum was vapour deposited under a degree of vacuum of $1\times10^{-6}$ torr to obtain a light-emitting area of 0.08 $cm^2$. Voltage was applied on this device and found a yellowish white light was emitted at 15 V with a EL spectrum cpveromg a wavelength range of 415 nm to 650 nm. As the voltage increased, the of its EL intensity was increased proprotionately, which indicated that its light color did not change with the voltage (as shown in FIG. 3).

EXAMPLE 4

Figure 4:
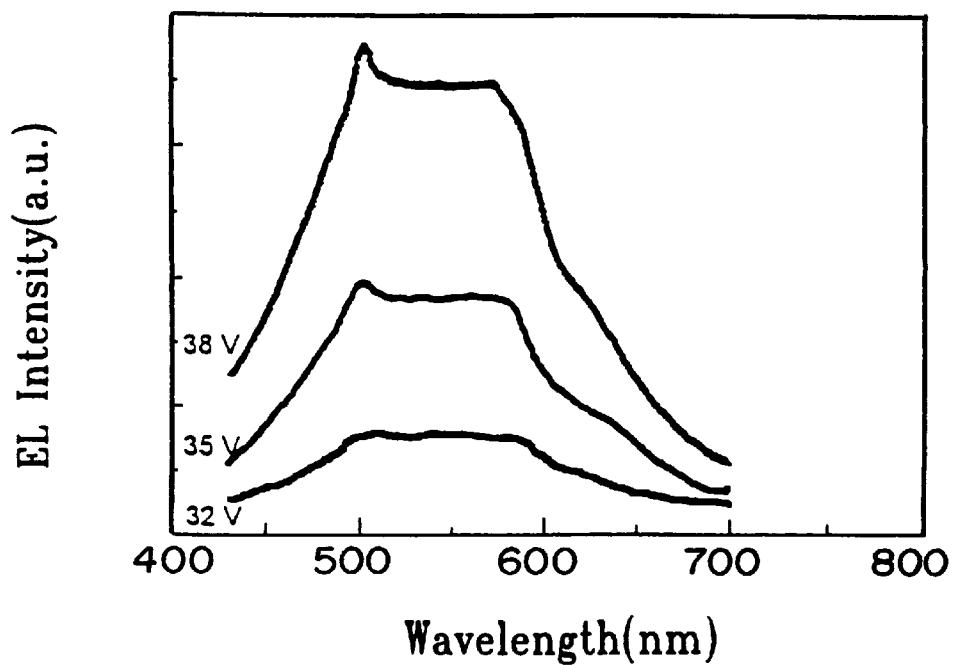
FIG. 4 shows an EL spectrum of an device ITO/PPVCOC10:PdOPV(14:1)/Ca/Ag under various applied voltages.
Figure 5:
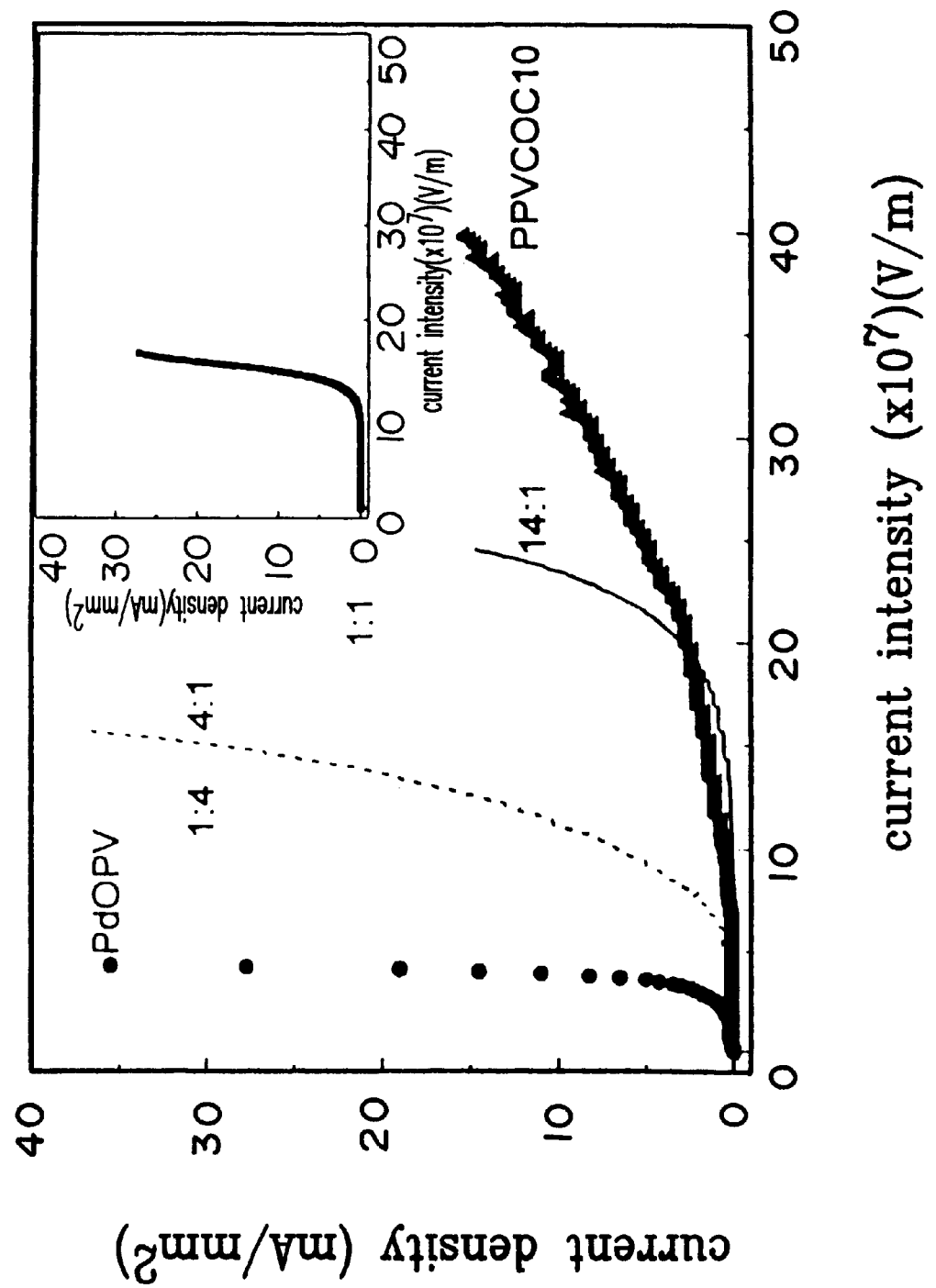
FIG. 5 shows a characteristic current density-field intensity diagram of an device ITO/PPVCOC10:PdOPV(14:1)/Ca/Ag; the inset shows the characteristic current density-field intensity diagram of an device ITO/SPAN:PVA(1:1)/PPVCOC10:PdOPV(14:1)/Ca/Ag.

Solutions of PPVCOC10 and PdOPV in chloroform were prepared separately each at a concentration of 10 mg/ml, and mixed the two resulted solutions at a ratio of PPVCOC10:PdOPV 14:1 to form a blend solution. The blend solution was spin-coated on a pre-cleaned ITO glass at a speed of 1000 rpm to form a film having thickness of 1200 Å. A layer of Ca as a metal having low working function and then a layer of silver as a protective layer was vapour deposited under a degree of vacuum of $1\times10^{-6}$ torr to obtain a light-emitting area of 0.08 $cm^2$. Voltage was applied on this device and found a yellowish white light was emitted at 32 V with a EL spectrum spanning a wavelength range of 450 nm to 650 nm. As the voltage increased, the contour of its EL spectrum was increased proprotionately, which indicated that its light color did not change with the voltage (as shown in FIG. 4 ). The turn-on electric field of this device was at about $21\times10^7$ V/m as shown in FIG. 5.

EXAMPLE 5

Figure 6:
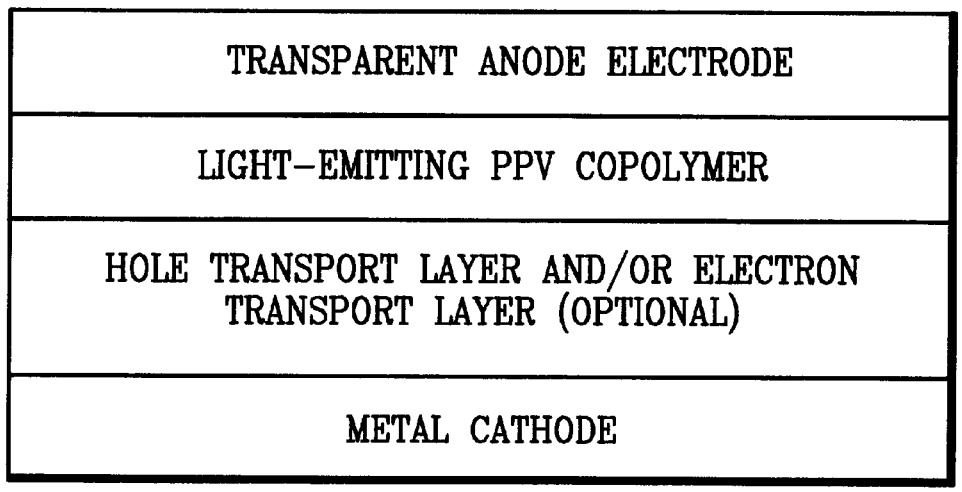
FIG. 6 is a schematic representation of the LED of the present invention.

An aqueous solution of sulfonic acid ring-substituted polyaniline (SPAN) and polyvinyl alcohol (PVA) (at a ratio of 1/1, concentration of 35.5 mg/ml) was spin-coated on a pre-cleaned ITO glass to form a hole transport layer which was dried at 80° C. under vacuum for two hours. Thereafter, a solution of PPVCOC10:PdOPV 14:1 in chloroform at a concentration of 10 mg/ml was spin-coated on the thus film-formed hole transport layer. A layer of Ca as a metal having low working function and then a layer of silver as a protective layer was vapour deposited under a degree of vacuum of $1\times10^{-6}$ torr to obtain a light-emitting area of 0.08 $cm^2$. The turn-on electric field of this device was at about $14\times10^7$V/m as shown in FIG. 6. Comparison of this device with that of Example 5 shows that, by incorporating a blend of SPAN and PVA, the turn-on electric field can be lowered by about one third.

Alternatively, a similar result can be obtained by replacing SPAN with poly(aniline-co-N-propane sulfonic acid aniline) (PAPASH).

Many changes and modifications in the above described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A light-emitting diode (LED) which emits near white light with a broad spectrum, and which comprises:

a transparent anode electrode, a metal cathode electrode, an organic light-emitting layer, and a hole transport layer and/or electron transport layer;

wherein said organic light-emitting layer comprises a blue light-emitting PPV copolymer having paraphenylene vinylene electroluminescent groups and soft groups represented by structure I below in a main chain thereof and a red light-emitting alkoxy-substituted PPV derivative represented by structure II below

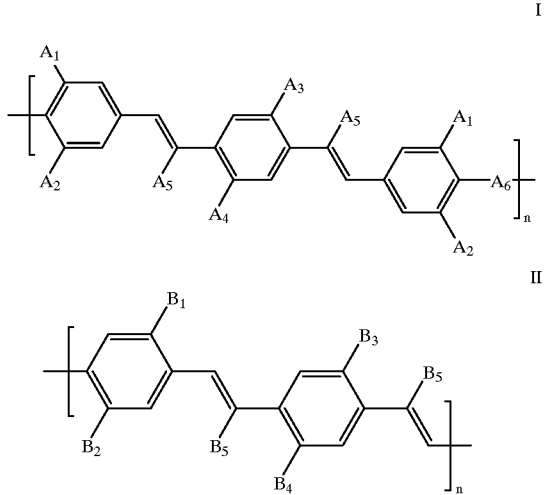

wherein,

A1, A2 is H, or —OCH$_3$;

A3, A4 is H, —(CH$_2$)$_n$CH$_3$, —O—(CH$_2$)$_n$CH$_3$, —(CH$_2$)$_n$—O—(CH$_2$)nCH$_3$, or —(CH$_2$—CH$_2$—O)nCH$_3$(n=1~22);

A5 is H, or —CH;

A6 is —O—(CH$_2$)nO—, —O—CH$_2$=CH$_2$—(O—CH$_2$—CH$_2$)n—O—, or —OCO(CH$_2$)n—OCO—, (n=1~12);

B1, B2, B3, B4 is —O—C$_n$H$_{2n+1}$(n=6~22), or —O—(CH$_2$—CH$_2$—O)$_n$CH$_3$ (n=1~10); and B5 is H, or —CN.

2. An LED according to claim 1, wherein said hole transport layer is interdisposed between said anode and said organic light-emitting layer.

3. An LED according to claim 2, wherein said conductive polymer is sulfonic acid ring-substituted polyaniline (SPAN), N-sulfonic acid substituted polyaniline (PAPSAH), or poly(3-alkyl sulfonic acid thiophene), where the alkyl group is $C_nH_{2n+1}$, where n=2,4,6.

4. An LED according to claim 1, wherein said electron transport layer is interdioposed between said organic light-emitting layer and said cathode.

5. An LED according to claim 1, wherein it comprises both of said hole transport layer interdisposed between said anode and said organic light-emitting layer and said electron transport layer interdisposed between said organic light-emitting layer and said cathode.

6. An LED according to claim 5, wherein said conductive polymer is sulfonic acid ring-substituted polyaniline (SPAN), N-sulfonic acid substituted polyaniline (PAPSAH), or poly(3-alkyl sulfonic acid thiophene), where the alkyl group is $C_nH_{2n+1}$, where n=2,4,6.

7. An LED according to claim 1, wherein an electrode substrate is formed by vapour depositing indium tin oxide on an organic plastic substrate or glass, or by applying conductive polymer on an organic plastic substrate or glass.

8. An LED according to claim 7, wherein said conductive polymer is sulfonic acid ring-substituted polyaniline (SPAN), N-sulfonic acid substituted polyaniline (PAPSAH), or poly(3-alkyl sulfonic acid thiophene), where the alkyl group is $C_nH_{2n+1}$, where n=2,4,6.

9. An LED according to claim 1, wherein metal of said cathode is one selected from the group consisting of In, Al, Al:Li alloy, Mg/Ag, Mg:Ag alloy, Ca/Ag and Ca/Al.

10. An LED according to claim 9, wherein said cathode metals are applied by thermal sublimation or sputtering.

11. An LED according to claim 1, wherein said PPV copolymer is the one represented by structure I wherein A1, A2 is —O—CH$_3$; A3, A4, A5 is H; and A6 is —O—(CH$_2$)$_n$—O—, where n is an integer of 5, 8 or 10.

12. An LED according to claim 1, wherein said PPV copolymer is the one represented by structure I wherein A1, A2 is —O—CH$_3$; A3, A4 is H; A5 is —CN; and A6 is —O—(CH2)n—O—, where n is an integer of 5, 8, or 10.

13. An LED according to claim 1, wherein said alkoxy-substituted PPV derivative is the one represented by structure II wherein B1,B2, B3 and B4 are —O—C$_n$H$_{2n+1}$, where n=6,8,10; and B5 is H.

14. An LED according to claim 1, wherein said alkoxy-substituted PPV derivative is the one represented by structure II wherein B1, B2, B3, and B4 are —O—C$_n$H$_{2n+1}$, where n=6,8, 10, and B5 is —CN.

15. An LED according to claim 1, wherein the weight ratio of said blue light-emitting PPV copolymer to said red light-emitting alkoxy-substituted PPV derivative is in a range of 150:1~10:1.

16. An LED according to claim 1, wherein metal of said cathode is applied by thermal sublimation or sputtering.

17. An LED according to claim 1, wherein said conductive polymer is sulfonic acid ring-substituted polyaniline (SPAN), N-sulfonic acid substituted polyaniline (PAPSAH), or poly(3-alkyl sulfonic acid thiophene), where the alkyl group is $C_nH_{2n+1}$, where n=2,4,6.

* * * * *